United States Patent [19]

Stangl

[11] 3,975,808

[45] Aug. 24, 1976

[54] METHOD FOR PRODUCING A KEY WHICH IS TO BE ACTUATED BY WAY OF A PRESSURE FORCE DIRECTIONED AND DIMENSIONED IN A CERTAIN MANNER

[75] Inventor: Franz Stangl, Frauental, Austria

[73] Assignee: Siemens Aktiengesellschaft, Berlin & Munich, Germany

[22] Filed: Sept. 11, 1975

[21] Appl. No.: 612,573

[30] Foreign Application Priority Data
Sept. 25, 1974 Germany............................ 2445805

[52] U.S. Cl. ............................ 29/25.35; 317/262 F
[51] Int. Cl.² .......................................... H01L 41/22
[58] Field of Search...................... 29/25.35; 333/72; 317/262 F; 310/8, 9.7

[56] References Cited
UNITED STATES PATENTS

| | | | |
|---|---|---|---|
| 2,940,035 | 6/1960 | Lefkowitz........................ | 317/262 F |
| 3,766,615 | 10/1973 | Shimizu ............................. | 29/25.35 |

Primary Examiner—Carl E. Hall
Attorney, Agent, or Firm—Hill, Gross, Simpson, Van Santen, Steadman, Chiara & Simpson

[57] ABSTRACT

For the reproduction of a piezoelectric key, metal layers and resistance layers are applied onto a ceramic substrate having a length which is greater than a multiple of the length of the individual keys. The metal layers are then, corresponding to the number of keys, provided with electrodes, and an additional auxiliary electrode is applied to one of the metal layers. After the ceramic member is encased with a thixotropic resin, by immersing, the substrate is polarized by short-circuited electrode pairs and applying a voltage between the short-circuited pairs and the auxiliary electrode. Thereafter, the individual keys are obtained by severing the same from the encased ceramic substrate.

3 Claims, 3 Drawing Figures

METHOD FOR PRODUCING A KEY WHICH IS TO BE ACTUATED BY WAY OF A PRESSURE FORCE DIRECTIONED AND DIMENSIONED IN A CERTAIN MANNER

The invention relates to a method for producing a key to be actuated with a pressure force directioned and dimensioned in a predetermined manner.

The key comprises a piezoelectric transducer and an electronic circuit having an amplifier for the triggering operation. The key is provided with a transducer which comprises a directionally and permanently polarized piezoelectric material, in the form of a substrate, which carries electrodes thereupon for the transfer of electrical voltage and current. The body of the transducer comprises an approximately constant cross section in each plane perpendicular to the direction with which the force affects the body and has a thickness $d$ which is small compared with a further dimension of the body. The body is polarized in the direction of the thickness $d$ and the electrodes are positioned on opposite surfaces of the body at a spacing of the thickness $d$ therebetween. The bodies are arranged in the key in such a way that the thickness $d$ is essentially directed perpendicular to the direction of the course which affects the body. Each body is polarized in a volume $d \cdot h_2 \cdot l$, where the dimension $l$ is a length dimension which is essentially perpendicular to the thickness $d$ which is perpendicular to the direction of the force, the dimension $l$ being at least a multiple larger than the dimension $d$ and the dimension $h_2$ being a dimension of a portion of the height of the body and perpendicular to the thickness $d$ and the length $l$. The dimension $h_2$ is larger than approximately ten times the thickness $d$. A low-pass filter, including a serially connected capacitor and resistor, is provided in the electronic circuit, parallel to the electrodes of the body of the converter, the resistance of the low-pass filter being constituted by a resistance layer applied onto the body of the converter.

SUMMARY OF THE INVENTION

It is a primary object of the invention to provide an inexpensive and automated method for the production of a piezo-ceramic pressure key.

This object is achieved, in accordance with the invention, in such a way that a continuous metal layer is applied onto the rear of a ceramic member having a length L which is at least a multiple of the length $l$ of the individual keys to be produced. Two mutually separate metal layers are applied onto the front of the ceramic substrate and a resistance layer, for each key, is applied onto the ceramic substrate connecting the front metal layers at a spacing corresponding to the distance of the individual keys. The rear metal layer and one of the front metal layers have electrodes applied thereto at a spacing corresponding to the spacing of the individual keys, and an auxiliary electrode is connected to the other front metal layer. The ceramic substrate is subsequently encased with, in particular, a thixotropic resin by submerging the element in resin, and the resin is hardened. At least one of the electrode pairs is short-circuited and that part of the ceramic substrate which is between the rear metal layer and a front metal layer is polarized by applying a polarization voltage between the short-circuited electrode pair and the auxiliary electrode. The short circuited electrode pair is then interrupted and the individual keys are obtained by severing the elements so produced at distances $l$.

BRIEF DESCRIPTION OF THE DRAWINGS

Other objects, features and advantages of the invention, its organization, construction and mode of operation will be best understood from the following detailed description taken in conjunction with the accompanying drawings, on which.

DESCRIPTION OF THE PREFERRED EMBODIMENT

Figure 1:
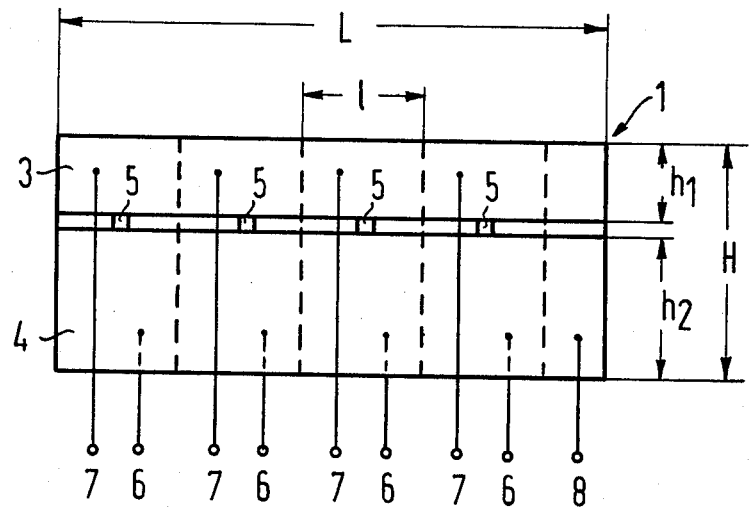
FIG. 1 is an elevational view of a plurality of keys during construction in accordance with the method of the present invention.

Referring to the drawings, a ceramic substrate 1 is illustrated having a length L. The length L is a multiple of a length $l$ of individual pressure keys, plus a small section as will be apparent from the description below. The ceramic substrate 1 has a height H and a thickness $d$ which correspond to the dimensions of the individual pressure keys. On the rear surface of the ceramic substrate 1, a continuous metal layer 2 is applied and on the front surface of the substrate 1, a pair of mutually separate metal layers 3 and 4 are applied, having the heights $h_1$ and $h_2$. The metal layers 2, 3 and 4 are applied onto the ceramic substrate in a manner which is well-known in the prior art, and preferably consists of silver.

After completion of the metalization steps, the front metal layers 3 and 4 are interconnected by way of printed resistance layers 5. The number of the printed resistances 5 corresponds to the number of the pressure keys to be formed from the ceramic substrate 1. The rear metal layer 2 is provided with a plurality of electrodes 6 and the front metal layer 3 is provided with a corresponding plurality of electrodes 7. The number of the electrodes pairs (6,7) again corresponds to the number of pressure keys to be formed. The front metal layer 4 is provided with an auxiliary electrode 8 which is used for subsequent polarization of the ceramic substrate 1.

After the ceramic substrate has been provided in the described manner with the metal layers, the resistances 5 and the electrodes 6, 7 and 8, it is encased within an artificial resin in order to obtain sufficient mechanical stability, the casing being advantageously obtained by submerging the ceramic substrate and the elements carried thereby into a thixotropic resin. The resin, if required, may then be hardened.

Figure 2:
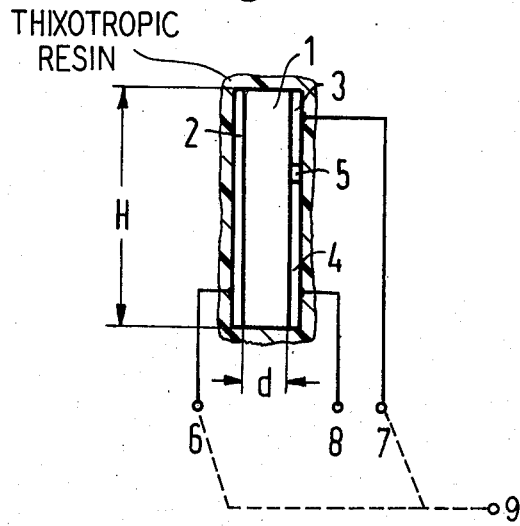
FIG. 2 is a left-hand end view of the structure illustrated in FIG. 1.
Figure 3:
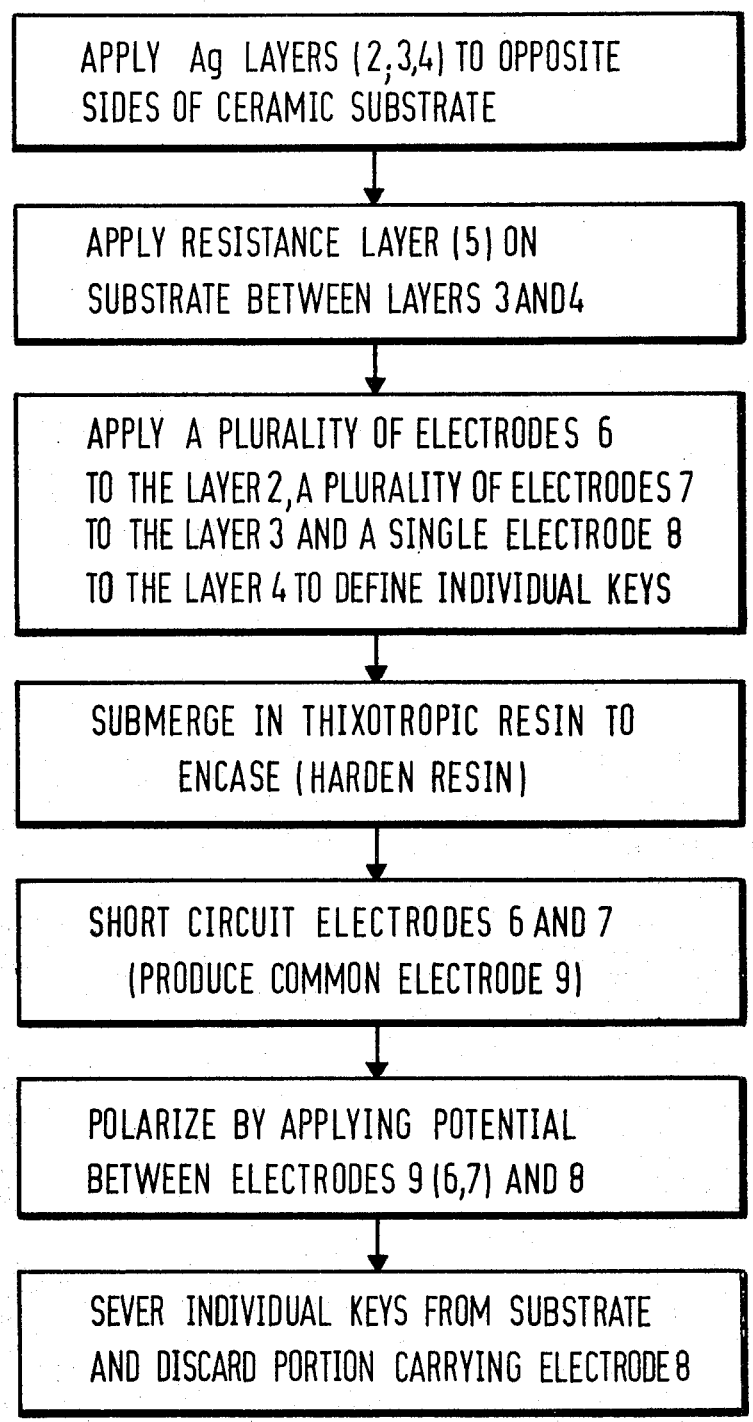
FIG. 3 is a flow chart illustrating the method of production of the individual keys according to the invention.

Since the ceramic substrate 1 is subjected to high temperatures, both during the application of the resistances 5 and during the application of the casing, a previous polarization would become ineffective, and due to this, such a polarization can only be carried out after the hardening of the casing. In order to avoid that the capacitively effective part between the metal layer 3 and the rear metal layer 2 is polarized in the completed pressure key, an electrode pair 6 and 7 is short-circuited, as indicated by the broken lines in FIG. 2, and the polarization voltage is applied between the short-circuited electrode pair, indicated by an electrode 9, and the auxiliary electrode 8, so that only that part of the ceramic substrate 1 is polarized which is positioned between the front metal layer 4 and the rear metal layer 2. After the polarization has been carried out, the individual pressure keys are obtained by severing the sections $l$ from the ceramic substrate 1, whereby the part carrying the auxiliary electrode 8 is discarded.

The thickness $d$ of the ceramic substrate 1 may be between 0.05 and 0.15mm. The length $l$ of the individual pressure key may vary between 3 and 2mm, and the height $h_2$ of the metal layer 5 may be between 5 and 25mm, whereby the ratio between the height $h_2$ of the metal layer 4 and the entire height H of the ceramic substrate 1 is between 0.6 and 0.8. The length L of the ceramic member 1 depends on the condition of the ceramic and is generally dimensioned in such a way that approximately eight individual pressure keys may be obtained from one ceramic substrate 1.

All together, the method of the invention is characterized in that it permits a rational production of piezoelectric pressure keys, since a large number of such pressure keys can be produced and polarized simultaneously.

Although I have described may invention by reference to a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method of producing piezoelectric keys each of which are to be actuated by the application of a predetermined and directed force and each of the keys including a body of permanently polarized material which carries electrodes for transfer of electrical voltage and current, each of the bodies having an approximately constant cross section and a thickness $d$ which is small in relation to further dimensions of the body in each plane perpendicular to the direction in which the directed force affects the body, the body polarized in the direction of the thickness $d$, the electrodes positioned on opposite surfaces of the body at a distance $d$ therebetween, each body polarized over a volume $d \cdot h_2 \cdot l$, where the thickness $d$ is perpendicular to the direction of the force, $l$ is the length of the body perpendicular to the thickness $d$ and perpendicular to the direction of the force and at least a multiple larger than the thickness $d$, and $h_2$ is a height dimension of a portion of the body perpendicular to the length $l$ and to the thickness $d$ and approximately ten times the thickness $d$, the key to be utilized in connection with a low-pass filter which comprises a resistor which is connected in parallel with electrodes carried on the body, the resistor being in the form of a resistance layer carried on the body, comprising the steps of:
    applying a continuous first metal layer on one surface of a piezo-ceramic substrate which has a length L which is greater than the length $l$ of a body times the number of bodies to be produced;
    applying spaced second and third metal layers on the opposite surface of the substrate;
    applying a resistance layer in the space between and contacting the second and third metal layers;
    applying first electrodes to the first metal layer spaced apart and equal to the number of keys to be produced;
    applying second electrodes to the second metal layer spaced apart and equal in number to the number of keys to be produced;
    applying a third electrode to the third layer;
    encasing the substrate carrying the first, second and third metal layers in a thixotropic resin;
    hardening the resin;
    applying an electrical potential between the first and second electrodes and the third electrode to polarize the substrate; and
    severing the substrate and metal layers at spaced intervals between each pair of first and second electrodes at distances $l$.

2. The method of claim 1, wherein the step of applying a potential comprises the steps of: shorting the first and second electrodes together before the application of the polarizing potential; and breaking the short-circuit connection after polarization.

3. The method of claim 1, wherein the step of encasing the substrate comprises the step of submerging the substrate in a thixotropic resin.

* * * * *